United States Patent
Blodgett et al.

(10) Patent No.: US 10,503,241 B2
(45) Date of Patent: Dec. 10, 2019

(54) PROVIDING ENERGY INFORMATION TO MEMORY

(71) Applicant: Micron Technology, Inc., Boise, ID (US)

(72) Inventors: Greg Blodgett, Nampa, ID (US); Daniele Balluchi, Cernusco sul Naviglio (IT); Danilo Caraccio, Milan (IT); Graziano Mirichigni, Vimercate (IT)

(73) Assignee: Micron Technology, Inc., Boise, ID (US)

( * ) Notice: Subject to any disclaimer, the term of this patent is extended or adjusted under 35 U.S.C. 154(b) by 139 days.

(21) Appl. No.: 15/815,209

(22) Filed: Nov. 16, 2017

(65) Prior Publication Data

US 2018/0336146 A1 Nov. 22, 2018

Related U.S. Application Data

(60) Provisional application No. 62/506,977, filed on May 16, 2017.

(51) Int. Cl.
*G06F 1/32* (2019.01)
*G11C 5/14* (2006.01)
(Continued)

(52) U.S. Cl.
CPC ........ *G06F 1/3275* (2013.01); *G06F 13/1668* (2013.01); *G11C 5/142* (2013.01);
(Continued)

(58) Field of Classification Search
CPC ........ G06F 1/3275; G06F 5/142; G06F 1/144; G06F 13/1668
See application file for complete search history.

(56) References Cited

U.S. PATENT DOCUMENTS

| 8,797,813 | B2 | 8/2014 | Ling et al. |
| 8,804,449 | B2 | 8/2014 | Barkley et al. |

(Continued)

FOREIGN PATENT DOCUMENTS

| CN | 104380381 | 2/2015 |
| CN | 106415724 | 2/2017 |

(Continued)

OTHER PUBLICATIONS

International Search Report and Written Opinion for related PCT Application No. PCT/US2018/032181, dated Sep. 27, 2018, 12 pages.

(Continued)

*Primary Examiner* — Stefan Stoynov
(74) *Attorney, Agent, or Firm* — Brooks, Cameron & Huebsch, PLLC

(57) ABSTRACT

The present disclosure includes apparatuses and methods for providing energy information to memory. An embodiment includes determining, by a host, that a charge level of an energy source coupled to the host has reached or exceeded a threshold value, and transmitting, from the host to a memory device coupled to the host, signaling indicative of an energy mode for the memory device, wherein the signaling is transmitted based at least in part on determining that the charge level of the energy source has reached or exceeded the threshold.

30 Claims, 4 Drawing Sheets

(51) Int. Cl.
　　*G06F 13/16*　　(2006.01)
　　*G06F 1/3234*　　(2019.01)
　　*G11C 16/30*　　(2006.01)
　　*G11C 11/4072*　　(2006.01)
　　*G11C 11/4074*　　(2006.01)
　　*G11C 16/20*　　(2006.01)

(52) U.S. Cl.
　　CPC .......... *G11C 5/144* (2013.01); *G11C 11/4072* (2013.01); *G11C 11/4074* (2013.01); *G11C 16/20* (2013.01); *G11C 16/30* (2013.01)

(56) References Cited

U.S. PATENT DOCUMENTS

| | | |
|---|---|---|
| 9,292,072 B2 | 3/2016 | Yang et al. |
| 9,343,116 B2 | 5/2016 | Mirichigni et al. |
| 2010/0274953 A1* | 10/2010 | Lee .................. G06F 1/266 711/103 |
| 2013/0301373 A1 | 11/2013 | Tam |
| 2013/0311801 A1 | 11/2013 | Kong et al. |
| 2014/0068313 A1 | 3/2014 | Shimpuku |
| 2015/0348599 A1 | 12/2015 | Mirichigni et al. |
| 2016/0259577 A1 | 9/2016 | Park et al. |

FOREIGN PATENT DOCUMENTS

| | | |
|---|---|---|
| KR | 10-1506675 | 3/2015 |
| TW | 201428475 | 7/2014 |
| TW | M520669 | 4/2016 |

OTHER PUBLICATIONS

Office Action for related Taiwan Patent Application No. 107116659, dated Feb. 22, 2019, 20 pages.

* cited by examiner

| FLAGS | | |
|---|---|---|
| Name | Default | Description |
| fPowerLossProtectOff | 0 | 0b: Data reliability in the event of power loss will be determined per LU by the setting of the bDataReliability parameter.<br><br>1b: Host guarantees stable power. Device is not required to protect previously written data against unexpected power loss. |
| fLowEnergyMode | 0 | 0b: Host has sufficient energy for normal operation.<br><br>1b: Host energy is low. Device is requested to conserve energy. |

*Fig. 2*

PROVIDING ENERGY INFORMATION TO MEMORY

PRIORITY INFORMATION

This application claims the benefit of U.S. Provisional Application No. 62/506,977, filed May 16, 2017, the contents of which are incorporated herein by reference.

TECHNICAL FIELD

The present disclosure relates generally to semiconductor memory and methods, and more particularly, to providing energy information to memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can retain stored data when not powered and can include NAND flash memory, NOR flash memory, phase change random access memory (PCRAM), resistive random access memory (RRAM), and magnetic random access memory (MRAM), among others.

Memory storage devices can be combined together to form a solid state drive (SSD). An SSD, an embedded Multi-Media Card (eMMC) memory, or a universal flash storage (UFS) memory, can include non-volatile memory (e.g., NAND flash memory, NOR flash memory, and/or wireless memory), and/or can include volatile memory (e.g., DRAM and/or SRAM), among various other types of non-volatile and volatile memory. Flash memory devices can include memory cells storing data in a charge storage structure such as a floating gate or charge trap, for instance, and may be utilized as non-volatile memory for a wide range of electronic applications. Flash memory devices may use a one-transistor memory cell that allows for high memory densities, high reliability, and low power consumption.

Improving memory storage devices, generally, may include increasing memory cell density, increasing read/write speeds or otherwise reducing operational latency, increasing reliability, increasing data retention, reducing power consumption, and/or reducing manufacturing costs, among other metrics.

BRIEF DESCRIPTION OF THE DRAWINGS

FIG. 2 illustrates a table of flags that can be used to turn on a power loss protection off mode and a low energy mode in a memory device in accordance with an embodiment of the present disclosure.

DETAILED DESCRIPTION

Figure 1:
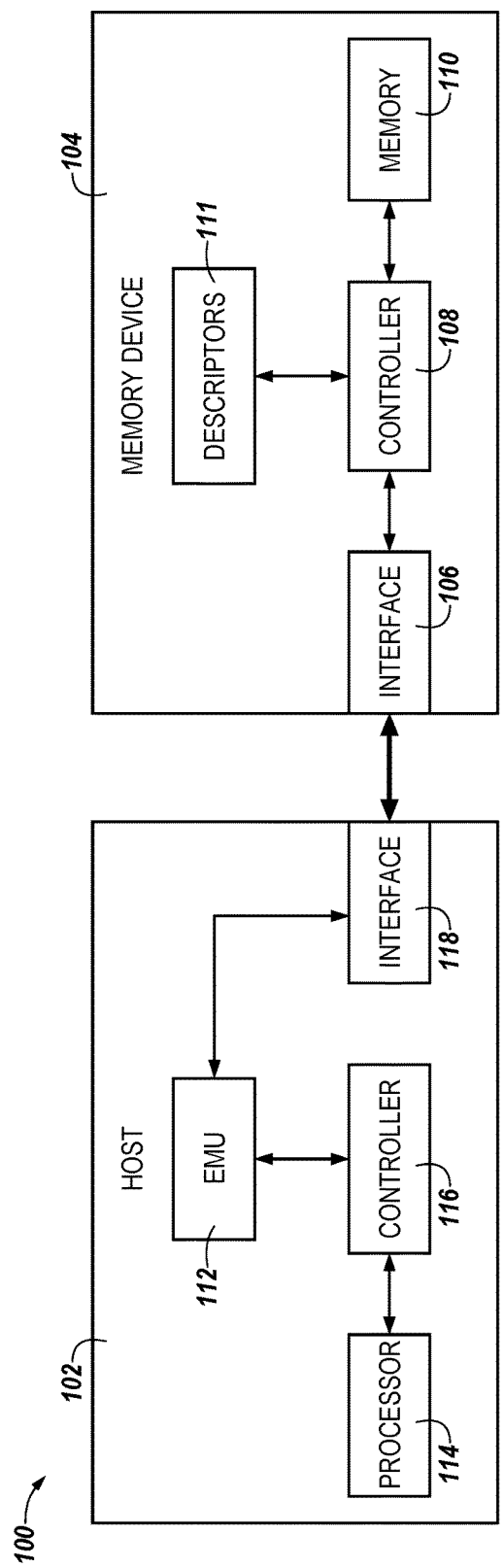
FIG. 1 illustrates a block diagram of a computing system in accordance with an embodiment of the present disclosure.

The present disclosure includes apparatuses and methods for providing energy information to memory. An embodiment includes determining, by a host, that a charge level of an energy source coupled to the host has reached or exceeded a threshold value, and transmitting, from the host to a memory device coupled to the host, signaling indicative of an energy mode for the memory device, wherein the signaling is transmitted based at least in part on determining that the charge level of the energy source has reached or exceeded the threshold.

Memory storage devices consume power while operating, such as during program, sense, and/or erase operations performed on the cells of the memory. This power can be provided to the memory by, for example, a host. However, in some instances, the amount of power provided to the memory may not be enough to sustain peak performance. For example, the amount of power and/or energy available to be provided to the memory by the host (e.g., the battery level of the host) may fall below a particular threshold, or may be suddenly and/or unexpectedly lost altogether (e.g., due to the battery being removed from the host or the host becoming unplugged). In such an instance (e.g., when the amount of system energy is low), the host may prefer to limit the energy consumed by the memory to improve user experience, for example, extending the amount of time the memory may operate.

To protect data that has programmed, and/or is in the process of being programmed, to the memory against such a power and/or energy decrease and/or loss, the memory may perform power loss protection operations, such as, for instance, sudden power off recovery operations, on the data, and/or may make extra copies of the data. However, such protection operations can adversely affect the operation and/or performance of the memory. For instance, such protection operations can increase the amount of time of a program operation performed on the memory, increase the amount of power and/or energy used by the memory, and/or take up storage space in the memory. Further, making extra copies of data can also take more time and/or use more power and/or energy.

Providing energy information to memory in accordance with the present disclosure can inform the memory of whether it is necessary for the memory to perform power loss protection operations, such as, for instance, sudden power off recovery operations, to protect data that has been programmed, and/or is in the process of being programmed, to the memory from sudden and/or unexpected power loss. When it is not necessary for the memory to perform such power loss protection operations, the memory can reduce the amount of time of operations (e.g., program operations) performed on the memory, consume less power and/or energy during those operations, and/or increase its storage space by not performing the power loss protection operations.

Further, providing energy information to memory in accordance with the present disclosure can inform the memory of whether a sufficient amount of energy is available to be provided to the memory to sustain normal operations, such as host command processing and maintenance operations. When the amount of energy available to the memory is not enough to sustain its normal operations, the memory can conserve energy by, for example, postponing maintenance operations (e.g., garbage collection, wear leveling, refresh, etc.).

As used herein, "a" or "an" can refer to one or more of something, and "a plurality of" can refer to more than one of such things. For example, a memory device can refer to one or more memory devices, and a plurality of memory devices can refer to two or more memory devices. Additionally, the designators "R", "B", and "S", as used herein, particularly with respect to reference numerals in the drawings, indicates that one or more of the particular feature so designated can be included with embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be references as 310 in FIG. 3.

FIG. 1 illustrates a block diagram of a computing system 100 in accordance with an embodiment of the present disclosure. As shown in FIG. 1, computing system 100 can include a host 102 and an apparatus in the form of a memory device 104. As used herein, an "apparatus" can refer to, but is not limited to, any of a variety of structures or combinations of structures, such as a circuit or circuitry, a die or dice, a module or modules, a device or devices, or a system or systems, for example.

Host 102 can include a memory, such as a random-access memory (RAM) (not shown in FIG. 1 so as not to obscure embodiments of the present disclosure), and a memory access device, such as a processor 114. One of ordinary skill in the art will appreciate that "a processor" can intend one or more processors, such as a parallel processing system, one or more coprocessors, etc. Example hosts can include laptop computers, personal computers, digital cameras, digital recording and playback devices, mobile devices (e.g., smart phones, tablets, etc.), PDAs, memory card readers, interface hubs, and the like.

As shown in FIG. 1, host 102 can include an energy management unit (EMU) 112. EMU 112 can determine energy information for memory device 104, and provide energy and the energy information to memory device 104, as will be further described herein. For example, host 102 can include or be coupled to an energy source (not shown in FIG. 1), such as for instance, a battery, a capacitor, a power outlet, etc., that provides energy to the host, and the energy source may also be used to provide energy to memory device 104.

As shown in FIG. 1, host 102 can include a controller 116 coupled to processor 114 and EMU 112, and an interface 118 coupled to controller 116 and EMU 112. Further, although not shown in FIG. 1 so as not to obscure embodiments of the present disclosure, host 102 may also include an application that communicates with memory device 104 using a driver (e.g., a UFS driver). The driver may manage controller 116 through a universal flash storage (UFS) host controller interface (not shown in FIG. 1) that may comprise a set of registers exposed by controller 116.

As shown in FIG. 1, memory device 104 can include an interface 106, a memory 110, descriptors 111, and a controller 108 coupled to interface 106, memory 110, and descriptors 111. In an embodiment, memory device 104 can be a universal flash storage (UFS) memory device. A UFS memory device can be, for example, a memory card (full or micro size), an embedded bootable mass storage device, or an IO device. Although not shown in FIG. 1 so as not to obscure embodiments of the present disclosure, a UFS device may also include multiple logical units (LUs) and a device manager. The device manager may perform device level functions such as power management, the LUs may perform functions such as reads and writes, and the descriptors 111 may store configuration related information. Further, although one memory 110 is shown in FIG. 1, embodiments of the present disclosure are not so limited (e.g., memory device 104 can include more than one memory coupled to controller 108).

Interfaces 106 and 118 can be used to communicate information (e.g., data) between host 102 and memory device 104. For example, interfaces 106 and 118 can provide an interface for passing control, address, information (e.g., data), and other signals between memory device 104 and host 102.

In an embodiment, interfaces 106 and 118 can be physical interfaces, such as standardized physical interfaces. For example, when memory device 104 is used for information storage in computing system 100, interfaces 106 and 111 can be UFS interfaces, serial advanced technology attachment (SATA) physical interfaces, peripheral component interconnect express (PCIe) physical interfaces, or universal serial bus (USB) physical interfaces, among other physical connectors and/or interfaces. For instance, when interfaces 106 and 111 are UFS interfaces, interfaces 106 and 111 can comprise a UFS interconnect (UIC) layer between host 102 and memory device 104 that includes MIPI UniPro and MIPI M-PHY. The physical layer M-PHY may be a differential, dual simplex PHY that includes TX and RX pairs. In such embodiments, memory device 104 can receive energy from, and/or communicate information with, host 102 through a wired connection with host 102 (e.g., host 102 and memory device 104 can be coupled through a wired connection).

Controller 108 can communicate with memory 110 to sense (e.g., read), program (e.g., write), and/or erase information, among other operations. Controller 108 can include, for example, control circuitry and/or logic (e.g., hardware and/or firmware). Controller 108 can be included on the same physical device (e.g., the same die) as memory 110, or can be included on a separate physical device that is communicatively coupled to the physical device that includes memory 110. In an embodiment, components of controller 108 can be spread across multiple physical devices (e.g., some components on the same die as memory 110, and some components on a different die, module, or board).

Memory 110 can include, for example, one or more non-volatile memory arrays (e.g., can include one or more non-volatile memory cells). For instance, memory 110 can be flash memory with a NAND architecture. An example of memory 110 will be further described herein (e.g., in connection with FIG. 3). However, embodiments of the present disclosure are not limited to a particular type of memory or memory device. For example, memory 110 can be DRAM, RRAM, FeRAM, or PCRAM, among other types of memory.

In a NAND architecture, the control gates of memory cells of a "row" can be coupled with an access (e.g., word) line, while the memory cells can be coupled in series source to drain in a "string" between a select gate source transistor and a select gate drain transistor. The string can be connected to a data (e.g., bit) line by the select gate drain transistor. The use of the terms "row" and "string" implies neither a linear nor an orthogonal arrangement of memory cells. As will be appreciated by those of ordinary skill in the art, the manner of connection of the memory cells to the bit lines and source lines depends on whether the array is a NAND architecture, a NOR architecture, or some other memory array architecture.

The memory array(s) of memory 110 can include one or more memory cells that can be grouped. As used herein, a group can include one or more memory cells, such as a page, block, plane, die, an entire array, or other groups of memory cells. For example, some memory arrays can include one or more of pages of memory cells that make up a block of memory cells. One or more blocks can be included in a plane of memory cells, and one or more planes of memory cells can be included on a die, as will be further described herein (e.g. in connection with FIG. 3). As an example, a 128 GB memory device can include 4320 bytes of information per page, 128 pages per block, 2048 blocks per plane, and 16 planes per device.

The embodiment illustrated in FIG. 1 can include additional circuitry that is not illustrated so as not to obscure embodiments of the present disclosure. For example, memory 110 can include address circuitry to latch address signals provided over I/O connectors through I/O circuitry. Address signals can be received and decoded by a row decoder and a column decoder, to access memory 110 (e.g., the array(s) of memory 110).

Host 102 (e.g., EMU 112, processor 114, and/or controller 116) can determine energy information for memory device 104 (e.g., memory 110), and provide the energy information to memory device 104 (e.g., controller 108). For instance, host 102 can process information including the characteristics (e.g., type) of its energy source (e.g., whether its battery is removable or non-removable), the charge level of its energy source, the capacity (e.g., charge storage capacity) of its energy source, the characteristics of system 100 and its user activity (e.g., rate of system power drain due to, for instance, the display being on or off), whether the energy source is currently charging, whether the energy currently being provided to memory device 104 is unlimited (e.g., since host 102 is plugged in to a socket), and/or the age of its energy source. Host 102 can use this processed information to determine whether it is necessary for memory device 104 to perform power loss protection operations (e.g., sudden power off recovery operations) to protect data that has been programmed and/or is in the process of being programmed to memory 110 from sudden and/or unexpected energy loss, and/or to determine whether a sufficient amount of energy is available from its energy source to sustain normal operations. Host 102 can then provide this determination(s) to memory device 104, using a single data bit, for example.

In contrast, in alternative approaches, such determinations may be made (e.g., processed) on the device level (e.g., by memory device 104) using only the energy source (e.g., battery) type and/or charge level provided by the host. However, energy source type and/or charge level alone may not provide sufficient information for the device to be able to make an accurate determination of whether it is necessary to perform power loss protection operations or whether a sufficient amount of energy is available to sustain normal operations, because, for instance, different host systems may have different battery capacities and/or different user activity characteristics that can have different effects on remaining availability. However, providing this additional information to the device for the device to use in making its determination may not be practical for the device (e.g., would use too much space and/or consume too much computational resources).

As an example, host 102 (e.g., EMU 112, processor 114, and/or controller 116) can determine and provide a power loss protection indicator of whether it is necessary for memory device 104 to perform power loss protection operations. Such an indicator can provide improved performance for memory device 104 (e.g., reduced operating times, reduced energy consumption, and/or increased storage) when host 102 can guarantee a stable and uninterrupted source of energy. Further, such an indicator can allow host 102 to quickly switch between turning power loss protection on and off in memory device 104.

For instance, when host 102 can guarantee it can provide a stable and uninterrupted source of energy to memory device 104, it can provide an indicator to turn power loss protection off. For instance, host 102 may enable power loss protection off mode in memory device 104. When power loss protection is turned off (e.g. when power loss protection off mode is enabled), host 102 may not cycle power to memory device 104, or send a hardware reset signal to memory device 104. Further, when power loss protection is turned off, memory device 104 may not protect previously programmed data against an unexpected power loss.

However, when host 102 can not guarantee it can provide a stable and uninterrupted source of energy to memory device 104, it can provide an indicator to turn the power loss protection on (e.g., to protect against an unexpected power loss). For instance, host 102 may disable power loss protection off mode in memory device 104. If no program operations have been performed in a power cycle with power loss protection turned on, then less error correction operations, or a different error correction operation, may be performed during the next power on cycle to improve the boot time. Further, if an unexpected loss of power does occur with power loss protection turned off, then data in memory 110 that appears to be corrupted may be discarded (e.g., instead of trying to repair it).

As an example, host 102 can guarantee a stable and uninterrupted source of energy when it is powered by an energy source that is not removable, but may not be able to guarantee a stable and uninterrupted source of energy when it is powered by an energy source that is removable (e.g. suddenly removable). Further, if an energy supply level of host 102 (e.g., the charge level of its battery) falls below a particular threshold (e.g., a minimum safe operating level) while power loss protection off mode is enabled and the power supply is suddenly lost, then data that was previously programmed to memory 110 may be corrupted if power loss occurs while new data is being written to the memory and/or maintenance operations are being performed by memory device 104. As such, if host 102 determines that the energy supply level has fallen below the threshold (e.g., that the charge level of its battery has fallen below the minimum safe operating level), host 102 may not be able to guarantee a stable and uninterrupted source of energy, and can provide an indicator to turn on the power loss protection (e.g., to disable power loss protection off mode). Further, if host 102 determines that it is being powered by an energy source that is removable, host 102 may keep power loss protection on (e.g., may not enable power loss protection off mode).

In an embodiment, memory device 104 (e.g. memory 110) may have (e.g., be configured with) a plurality of logical units of data. In such an embodiment, each respective logical unit may have a data reliability mode associated therewith. If power loss protection is turned off (e.g., because host 102 is not concerned about possible data corruption due to low energy supply or power loss), host 102 can globally disable data reliability mode for all logical units. However, if power loss protection is turned on (e.g., if power loss protection off mode is disabled), some, none, or all, of the logical units may have data reliability mode enabled. As an example, if the memory device is configured with two logical units, neither of the logical units may have data reliability mode enabled, only a first one or only a second one of the logical units may have data reliability mode enabled, or both of the logical units may have data reliability mode enabled. In such an embodiment, power loss protection operations may be performed on only the logical unit(s) whose data reliability mode is enabled (e.g., only the logical units whose data reliability mode is enabled may have their data protected against unexpected power loss); power loss protection operations may not be performed on the logical unit(s) having data reliability mode disabled (e.g., the logical unit(s) whose data reliability mode is disabled may not have their data protected against unexpected power loss), even though power loss protection may be turned on.

As an additional example, host 102 (e.g., EMU 112, processor 114, and/or controller 116) can determine and provide a low energy mode indicator of whether a sufficient amount of energy is available (e.g., from its battery) to sustain the present level of performance of memory device 104. For instance, the low energy mode indicator can indicate whether a sufficient amount of energy is available to sustain normal operations of memory device 104, such as processing commands received from host 102 (e.g., read, write, and erase commands) and performing maintenance operations. Such an indicator can provide a mechanism for host 102 to request memory device 104 to conserve system energy.

In an embodiment, host 102 (e.g., EMU 112, processor 114, and/or controller 116) can determine that the charge level of the energy source of (or coupled to) the host has reached or exceeded a threshold value, and transmit (e.g., via interface 118) to memory device 104 signaling indicative of an energy mode for memory device 104 based at least in part on the determination that the charge level of the energy source has reached or exceeded the threshold. For instance, the signaling may include a write descriptor and data that indicates the energy mode for memory device 104, or may set or clear a flag that enables or disables the energy mode for memory device 104. The flag may comprise a Boolean value representative of one energy mode selected from a set of energy modes for memory device 104. The energy mode can be, for instance, a first mode for which host 102 has sufficient energy for normal operation of memory device 104, or a second mode for which memory device 104 is requested to conserve energy. Memory device 104 (e.g., controller 108) can determine whether to perform one or more background (e.g., maintenance) operations based, at least in part, on the signaling received (e.g., via interface 106) from host 102. For instance, memory device 104 may decode the write descriptor and data and write a value associated with the energy mode to a descriptor 111 of the memory device based, at least in part, on information decoded from the write descriptor and data.

For example, host 102 can determine the amount of energy available from the host has fallen below a particular level, and turn on (e.g., enable) low energy mode in memory device 104 upon determining the amount of energy available from the host has fallen below the particular level. The particular level can correspond to the amount of energy sufficient to sustain normal operations for memory device 104. The amount of energy available from the host can correspond to the amount of energy available from an energy source of the host, such as, for instance, the present charge level of the battery of the host. Host 102 can turn on low energy mode in memory device 104 using, for example, a low energy mode flag, as will be further described herein (e.g., in connection with FIG. 2).

Upon low energy mode being turned on in memory device 104, memory device 104 can conserve energy. For example, memory device 104 can reduce its energy consumption (e.g., from its present level of energy consumption) upon low energy mode being turned on by host 102, as will be further described herein. Once host 102 determines the amount of energy available from the host has risen back above the particular level, host 102 can turn off (e.g., disable) low energy mode in memory device 104.

For instance, if host 102 is powered by a battery, and the charge level of the battery falls below a particular (e.g., low) charge level, host 102 can turn on (e.g., enable) low energy mode and conserve energy; when the charge level of the battery rises above the particular level, host 102 can turn off (e.g., disable) low energy mode, and memory device 102 can resume its previous level of performance. As an additional example, host 102 may turn low energy mode off upon determining it is directly connected to an additional energy source (e.g., plugged in and/or charging). In such an example, host 102 may turn low energy mode off upon determining it is directly connected to an additional energy source even if the battery charge level is still below (e.g., has not yet risen back above) the particular charge level. As an additional example, host 102 can turn low energy mode on upon determining its temperature level has risen above a particular level (e.g., even if the battery charge is above the particular charge level) in order to reduce the temperature of host 102 and/or system 100; when the temperature level of host 102 falls below the particular level, host 102 can turn low energy mode back off.

When low energy mode is turned on (e.g., enabled) in memory device 104, memory device 104 may conserve energy (e.g., reduce its energy consumption) by, for example, limiting or postponing the performance of some, or all, background (e.g., maintenance) operations (e.g., until low energy mode is turned off). For instance, memory device 104 may limit or postpone the performance of operations other than read, write, and/or erase operations, such as, for instance, background (e.g., maintenance) operations, on memory 110. Maintenance operations can include, for example, wiping operations, garbage collection operations, wear leveling operations, refresh operations, and bad block management, and may be executed in the foreground (e.g., during host command processing) or the background (e.g., when the memory device is not processing host commands). Reducing the energy consumption of memory device 104 in such a manner, however, may not necessarily result in a lower instantaneous performance or power consumption of memory device 104 or system 100.

Turning on low energy mode (e.g., postponing maintenance operations) in memory device 104 may conserve system energy and/or reduce the amount of data lost if power runs out, but may also reduce the performance of memory device 104 (e.g., as compared to when low energy mode is turned off). For example, the performance of memory device 104 may be reduced until low energy mode has been subsequently turned off and memory device 104 has completed the postponed maintenance operations.

As an additional example, memory device 104 can conserve power by performing fewer operations in parallel (e.g., fewer than when low energy mode is turned off) on memory 110. For instance, the number of dies operating in parallel may be reduced to one or two while low energy mode is turned on.

As an additional example, when low energy mode is turned on, memory device 104 may conserve energy by reducing the frequency of the internal clock of controller 108, reducing the interface speed between controller 108 and memory 110, and/or turning off on die termination functionality in memory 110. Further, when low energy mode is turned on, data being programmed to memory 110 during a programming operation may be stored by host 102 (e.g., in SRAM of the host) until the programming operation is complete, in order to protect against a power glitch that may occur during programming due to low battery charge, for instance (though this may not be effective if host 102 includes only a single battery). Further, power loss mode may be overridden when low energy mode is turned on.

In an embodiment, turning on low energy mode may include enabling one of a plurality of low energy modes in memory device 104, with each respective one of the modes using a different mechanism(s) to reduce the energy consumption of the device. For example, a first one of the low energy modes can include only performing fewer operations in parallel, a second one of the low energy modes can include only limiting or postponing maintenance operations, and a third one of the low energy modes can be a lowest energy mode that uses multiple energy reducing mechanisms (e.g., reduce to one operating die, reduce the internal clock frequency, reduce the interface speed, etc.) The multiple low energy modes can be enabled using multiple data bits.

FIG. 2 illustrates a table 220 of flags that can be used to turn on (e.g., enable) a power loss protection off mode and a low energy mode in a memory device in accordance with an embodiment of the present disclosure. For example, the flags can be used by host 102 of system 100 to enable power loss protection off mode and/or low energy mode in memory device 104 previously described in connection with FIG. 1. As used herein, a flag can refer to a single Boolean value that represents a TRUE or FALSE, 0 or 1, ON or OFF type of value. A flag can be cleared or reset, set, toggled or read, and can be used to enable to or disable particular functions, modes, or states within a memory device.

As shown in FIG. 2, the flags can include a power loss protection off flag (e.g., fPowerLossProtectOff), and a low energy mode flag (e.g., fLowEnergyMode). Each respective flag can include a single data bit (e.g., 0 or 1) to provide an indication to the memory device to enable power loss protection off mode and low energy mode, respectively, with the default bit for both flags being 0, as illustrated in FIG. 2. For instance, fLowEnergyMode is the flag used to enable or disable the execution of low energy mode. This flag may be defined as follows: 0=device is not permitted to run in low energy mode; 1=device is permitted to run in low energy mode. The default value of this flag may be zero: low energy mode not permitted. The device shall not operate in low energy mode when this flag is cleared by the host.

In the example shown in FIG. 2, a data bit of 0 for the power loss protection off flag can provide an indication to the memory device to enable power loss protection off mode. In the example illustrated in FIG. 2, when power loss protection off mode is disabled (e.g., when the data bit for the power loss protection off flag is set to 0), the data reliability mode of each respective logical unit of data can be determined based on the setting of the data reliability parameter associated that logical unit. For instance, if the setting of the data reliability parameter associated with a logical unit indicates that data reliability mode is enabled for that logical unit, power loss protection off mode can be enabled for that logical unit, and the existing data stored in that logical unit can be protected from corruption if a power loss occurs. As an example, the data reliability parameter associated with each respective logical unit can include a single data bit, with a setting of 1 indicating data reliability mode is enabled for that logical unit and a setting of 0 indicating data reliability mode is disabled for that logical unit.

Further, a data bit of 1 for the power loss protection off flag can provide an indication to the memory device to enable power loss protection off mode. For instance, as illustrated in FIG. 2, the host may disable power loss protection off mode when it can guarantee a stable source of power. When power loss protection off mode is enabled (e.g., when the data bit for the power loss protection off flag is set to 1), the memory device may not need to protect previously programmed (e.g., previously written) data against unexpected power loss. For example, when power loss protection off mode is enabled, data reliability mode for all logical units of data may be disabled. However, in an embodiment, some data stored in the memory, such as, for instance, replay protected memory block (RPMB) data, may be protected against power loss regardless of the setting of the power loss protection off mode flag.

As shown in FIG. 2, a data bit of 0 for the low energy mode flag can provide an indication to the memory device to turn low energy mode off, as the host has determined it can provide sufficient energy for the memory device to sustain its normal operation. Further, a data bit of 1 for the low energy mode flag can provide an indication to the memory device to turn low energy mode on and conserve energy, as the host has determined the amount of energy it can provide to the memory device is low.

Embodiments of the present disclosure, however, are not limited to the specific data bit examples illustrated in FIG. 2. For instance, in an embodiment, the low energy mode flag may include multiple data bits to indicate multiple low energy modes, as previously described herein.

Figure 3:
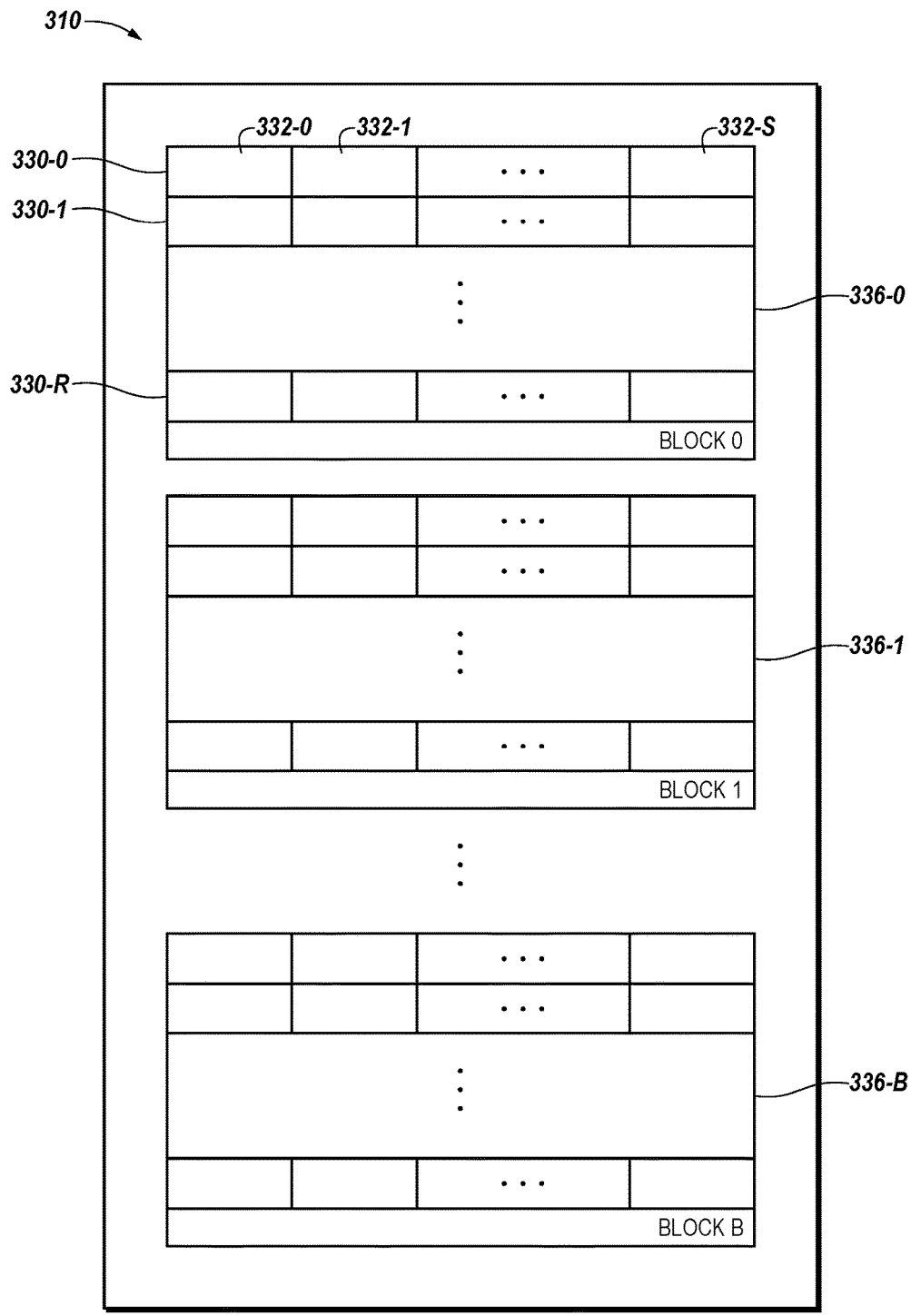
FIG. 3 illustrates a diagram of a portion of a memory array in accordance with an embodiment of the present disclosure.

FIG. 3 illustrates a diagram of a portion of a memory array 310 in accordance with an embodiment of the present disclosure. Memory array 310 can be, for example, memory 110 previously described in connection with FIG. 1. Further, although not shown in FIG. 3, memory array 310 can be located on a particular semiconductor die along with various peripheral circuitry associated with the operation thereof.

As shown in FIG. 3, memory array 310 can include one or more physical blocks 336-0 (BLOCK 0), 336-1 (BLOCK 1), . . . , 336-B (BLOCK B) of memory cells. The memory cells can be single level cells and/or multilevel cells such as, for instance, two level cells, triple level cells (TLCs) or quadruple level cells (QLCs). As an example, the number of physical blocks in memory array 100 may be 128 blocks, 512 blocks, or 1,024 blocks, but embodiments are not limited to a particular power of two or to any particular number of physical blocks in memory array 310.

One or more physical blocks of memory cells (e.g., blocks 336-0, 336-1, . . . , 336-B) can be included in a plane of memory cells, and one or more planes of memory cells can be included on a die. For instance, in the example shown in FIG. 3, each physical block 336-0, 336-1, . . . , 336-B can be part of a single die. That is, the portion of memory array 310 illustrated in FIG. 3 can be die of memory cells.

As shown in FIG. 3, each physical block 336-0, 336-1, . . . , 336-B includes one or more physical rows (e.g., 330-0, 330-1, . . . , 330-R) of memory cells coupled to access lines (e.g., word lines). The number of rows (e.g., word lines) in each physical block can be 32, but embodiments are not limited to a particular number of rows 330-0, 330-1, . . . , 330-R per physical block. Further, although not shown in FIG. 3, the memory cells can be coupled to sense lines (e.g., data lines and/or digit lines).

As one of ordinary skill in the art will appreciate, each row 330-0, 330-1, . . . , 330-R can include one or more pages of memory cells (e.g., physical pages). A physical page refers to a unit of programming and/or sensing (e.g., one or more memory cells that are programmed and/or sensed together as a functional group). In the embodiment shown in FIG. 3, each row 330-0, 330-1, . . . , 330-R comprises one physical page of memory cells. However, embodiments of the present disclosure are not so limited. For instance, in an embodiment, each row can comprise multiple physical pages of memory cells (e.g., one or more even pages of memory cells coupled to even-numbered bit lines, and one or more odd pages of memory cells coupled to odd numbered bit lines). Additionally, for embodiments including multilevel cells, a physical page of memory cells can store multiple pages (e.g., logical pages) of data (e.g., an upper page of data and a lower page of data, with each cell in a physical page storing one or more bits towards an upper page of data and one or more bits towards a lower page of data).

A program operation (e.g., a write operation) can include applying one or more program pulses (e.g., 16V-20V) to a selected word line in order to increase the threshold voltage (Vt) of the selected cells coupled to that selected word line to a desired program voltage level corresponding to a target (e.g., desired) data state. A sense operation, such as a read or program verify operation, can include sensing a voltage and/or current change of a sense line coupled to a selected cell in order to determine the data state of the selected cell.

As shown in FIG. 3, a page of memory cells can comprise one or more physical sectors 332-0, 332-1, . . . , 332-S (e.g., subsets of memory cells). Each physical sector 332-0, 332-1, . . . , 332-S of cells can store one or more logical sectors of data (e.g., data words). Additionally, each logical sector of data can correspond to a portion of a particular page of data. As an example, a first logical sector of data stored in a particular physical sector can correspond to a logical sector corresponding to a first page of data, and a second logical sector of data stored in the particular physical sector can correspond to a second page of data. Each physical sector 332-0, 332-1, . . . , 332-S, can store system and/or user data, and/or can include overhead data, such as error correction code (ECC) data and logical block address (LBA) data.

Logical block addressing is a scheme that can be used by a host (e.g., host 102 previously described in connection with FIG. 1) for identifying a logical sector of data. For example, each logical sector can correspond to a unique logical block address (LBA). Additionally, an LBA may also correspond (e.g., dynamically map) to a physical address. A logical sector of data can be a number of bytes of data (e.g., 256 bytes, 512 bytes, or 1,024 bytes). However, embodiments are not limited to these examples.

It is noted that other configurations for the physical blocks 336-0, 336-1, . . . , 336-B, rows 330-0, 330-1, . . . , 330-R, sectors 332-0, 332-1, . . . , 332-S, and pages are possible. For example, rows 330-0, 330-1, . . . , 330-R of physical blocks 336-0, 336-1, . . . , 336-B can each store data corresponding to a single logical sector which can include, for example, more or less than 512 bytes of data.

Figure 4:
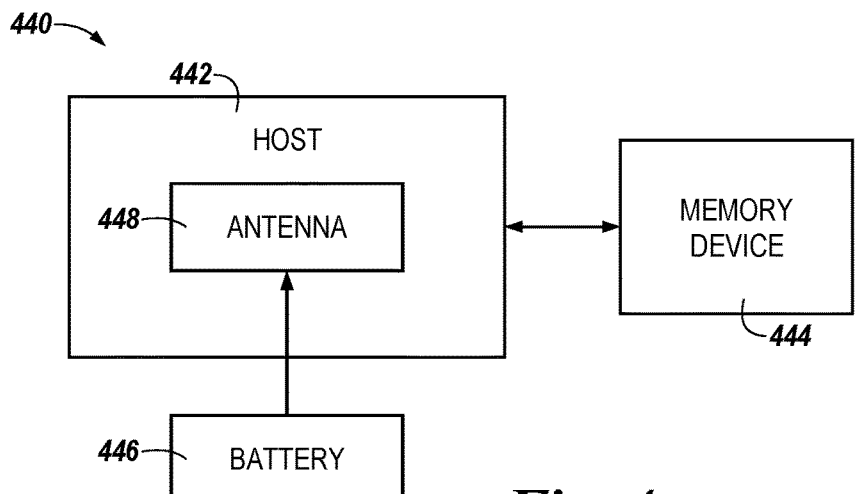
FIG. 4 illustrates a block diagram of a computing system in accordance with an embodiment of the present disclosure.

FIG. 4 illustrates a block diagram of a computing system 440 in accordance with an embodiment of the present disclosure. As shown in FIG. 4, computing system 440 can include a host 442, a memory device 444, and an energy source in the form of a battery 446 coupled to host 442. In the example embodiment illustrated in FIG. 4, host 442 can be a mobile device, such as a smart phone or tablet, for instance. Battery 446 can provide energy to host 442 and/or memory device 444.

Host 442 can include an EMU, processor, controller, and interface analogous to EMU 112, processor 114, controller 116, and interface 118, respectively, previously described in connection with FIG. 1. Further, in the example illustrated in FIG. 4, host 442 can include a wireless interface in the form of an antenna 448 that can transmit and/or receive wireless (e.g., over-the-air) signals, such as, for instance, cellular and/or Wi-Fi signals. Memory device 444 can include a memory, descriptors, a controller, and an interface analogous to memory 110, descriptors 111, controller 108, and interface 106, respectively, previously described in connection with FIG. 1.

Host 442 can determine energy information for memory device 444, and provide the energy information to memory device 444, in a manner analogous to that previously described herein (e.g., in connection with FIG. 1). For example, host 442 can determine and provide a power loss protection indicator of whether it is necessary for memory device 444 to perform power loss protection operations, in a manner analogous to that previously described herein. As an additional example, host 442 can determine and provide a low energy mode indicator of whether a sufficient amount of energy is available from batter 446 to sustain the present level of performance of memory device 444, in a manner analogous to that previously described herein.

Figure 5:
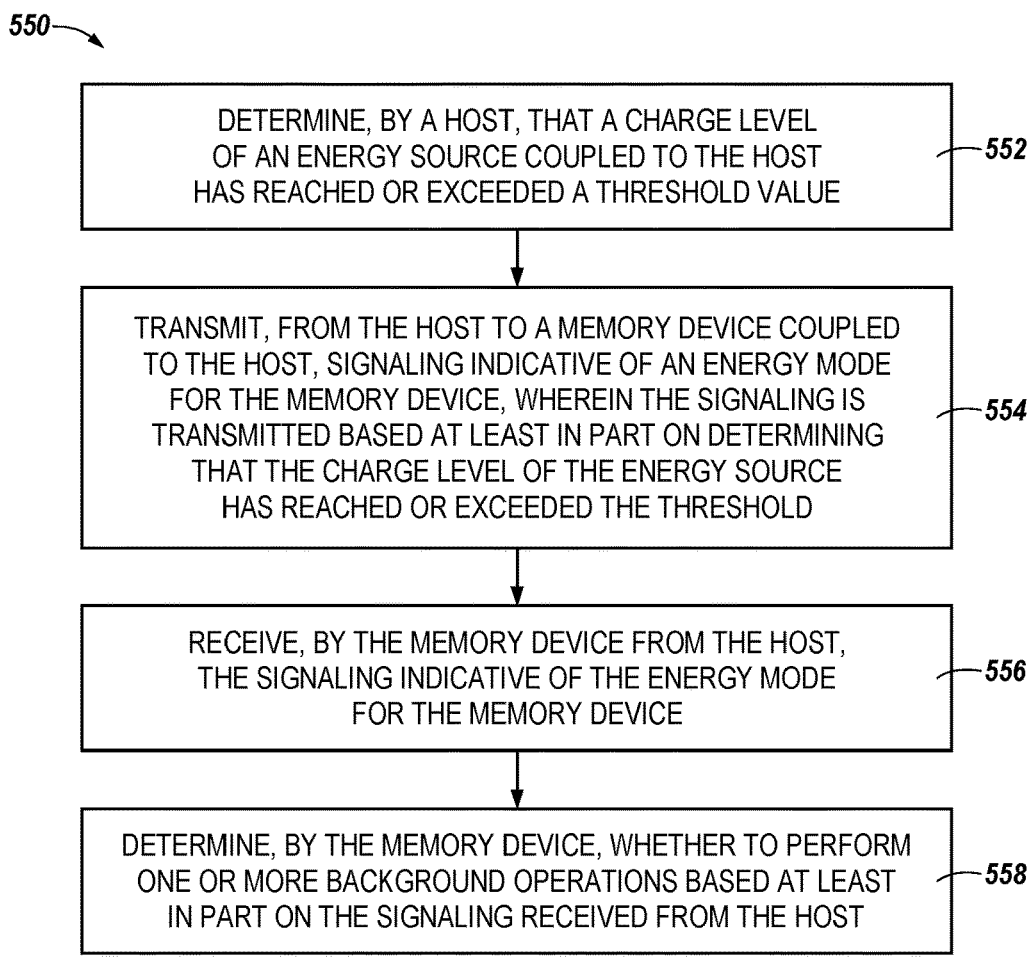
FIG. 5 illustrates a method for operating memory in accordance with an amendment of the present disclosure.

FIG. 5 illustrates a method 550 for operating memory in accordance with an amendment of the present disclosure. Method 550 can be performed by, for example, memory systems 100 and/or 440 previously described in connection with FIGS. 1 and 4, respectively.

At block 552, method 550 includes determining, by a host, that a charge level of an energy source coupled to the host has reached or exceeded a threshold value. The host can be, for example, host 102 and/or host 442 previously described in connection with FIGS. 1 and 4, respectively.

At block 554, method 550 includes transmitting, from the host to a memory device coupled to the host, signaling indicative of an energy mode for the memory device, wherein the signaling is transmitted based at least in part on determining that the charge level of the energy source has reached or exceeded the threshold. The memory device can be, for example, memory device 104 and/or 444 previously described in connection with FIGS. 1 and 4, respectively.

At block 556, method 550 includes receiving, by the memory device from the host, the signaling indicative of the energy mode for the memory device. At block 558, method 550 includes determining, by the memory device, whether to perform one or more background operations based at least in part on the signaling received from the host.

Although specific embodiments have been illustrated and described herein, those of ordinary skill in the art will appreciate that an arrangement calculated to achieve the same results can be substituted for the specific embodiments shown. This disclosure is intended to cover adaptations or variations of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of embodiments of the present disclosure includes other applications in which the above structures and methods are used. Therefore, the scope of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   determining, by a host:
      that a charge level of an energy source coupled to the host has reached or exceeded a threshold value; and
      whether the energy source is a removable energy source; and
   transmitting, from the host to a memory device coupled to the host, signaling indicative of an energy mode for the memory device, wherein the signaling is transmitted based at least in part on determining that the charge level of the energy source has reached or exceeded the threshold and that the energy source is a removable energy source, wherein the signaling refrains from enabling a particular energy mode for the memory device when the energy source is a removable energy source.

2. The method of claim 1, wherein transmitting the signaling indicative of the energy mode for the memory device includes transmitting a write descriptor and data that indicates the energy mode for the memory device.

3. The method of claim 1, wherein transmitting the signaling indicative of the energy mode for the memory device includes setting or clearing a flag that enables or disables the energy mode for the memory device.

4. The method of claim 3, wherein the flag comprises a Boolean value representative of one energy mode selected from a set of energy modes for the memory device.

5. The method of claim 1, wherein the energy mode comprises:
   a first mode for which the host has sufficient energy for normal operation of the memory device; or
   a second mode for which the memory device is requested to conserve energy.

6. The method of claim 5, wherein the normal operation of the memory device includes:
   processing commands received from the host; and
   performing background operations.

7. The method of claim 6, wherein the background operations include at least one of wear leveling, bad block management, wiping, or garbage collection, or any combination thereof.

8. The method of claim 1, wherein the energy mode comprises one of a plurality of low energy modes, wherein each respective one of the plurality of low energy modes includes a different mechanism for reducing energy consumption of the memory device.

9. A method, comprising:
   receiving, by a memory device from a host coupled to the memory device:
      signaling indicative of an energy mode for the memory device; and
      signaling indicative of whether an energy source is a removable energy source, wherein the signaling refrains from enabling a particular energy mode for the memory device if the energy source is a removable energy source; and
   determining, by the memory device, whether to perform one or more background operations based at least in part on the signaling received from the host.

10. The method of claim 9, wherein receiving the signaling indicative of the energy mode includes receiving a write descriptor and data that indicates the energy mode for the memory device.

11. The method of claim 10, wherein the method includes:
   decoding the write descriptor and data; and
   writing a value associated with the energy mode to a descriptor of the memory device based at least in part on information decoded from the write descriptor and data.

12. The method of claim 9, wherein receiving the signaling indicative of the energy mode includes setting or clearing a flag that enables or disables the energy mode for the memory device.

13. The method of claim 12, wherein the flag comprises a Boolean value representative of one energy mode selected from a set of energy modes for the memory device.

14. The method of claim 9, wherein the energy mode comprises:
   a first mode for which the host has sufficient energy for normal operation of the memory device; or
   a second mode for which the memory device is requested to conserve energy.

15. The method of claim 14, wherein the normal operation of the memory device includes:
   processing commands received from the host; and
   performing the one or more background operations.

16. The method of claim 9, wherein the one or more background operations include at least one of wear leveling, bad block management, wiping, or garbage collection, or any combination thereof.

17. The method of claim 9, wherein the energy mode comprises one of a plurality of low energy modes, wherein each respective one of the plurality of low energy modes includes a different mechanism for reducing energy consumption of the memory device.

18. A system, comprising:
   a processor; and
   a controller coupled to the processor, wherein at least one of the processor or controller is configured to determine:
      that a charge level of an energy source coupled with the processor has reached or exceeded a threshold value; and
      whether the energy source is a removable energy source; and
   an interface coupled with the controller and configured to transmit, to a memory device, signaling indicative of an energy mode for the memory device based at least in part on the processor or controller determining that the charge level of the energy source has reached or exceeded the threshold and whether the energy source is a removable energy source; and
   wherein the controller or processor is configured to refrain from enabling a particular energy mode for the memory device if the energy source is a removable energy source.

19. The system of claim 18, wherein the signaling indicative of the energy mode for the memory device includes a write descriptor and data that indicates the energy mode for the memory device.

20. The system of claim 18, wherein the signaling indicative of the energy mode for the memory device includes a flag that enables or disables the energy mode for the memory device.

21. The system of claim 20, wherein the flag comprises a Boolean value representative of one energy mode selected from a set of energy modes for the memory device.

22. The system of claim 18, wherein the energy mode comprises a mode for which the host has sufficient energy for normal operation of the memory device.

23. The system of claim 18, wherein the energy mode comprises a mode for which the memory device is requested to conserve energy.

24. The system of claim 18, wherein the energy mode comprises one of a plurality of low energy modes, wherein each respective one of the plurality of low energy modes includes a different mechanism for reducing energy consumption of the memory device.

25. A memory device, comprising:
   an interface configured to receive signaling indicative of an energy mode for the memory device and whether the energy source is a removable energy source, wherein the signaling refrains from enabling a particular energy mode for the memory device if the energy source is a removable energy source;
   control circuitry coupled with the interface; and
   an array of nonvolatile memory cells;
   wherein the control circuitry is configured to determine whether to perform one or more background operations on the array of nonvolatile memory cells based at least in part on signaling indicative of the energy mode for the memory device.

26. The memory device of claim 25, wherein:
   the signaling indicative of the energy mode includes a write descriptor and data that indicates the energy mode for the memory device; and
   the control circuitry is configured to:
      decode the write descriptor and data; and
      write a value associated with the energy mode to a descriptor of the memory device based at least in part on information decoded from the write descriptor and data.

27. The memory device of claim 25, wherein:
   the signaling indicative of the energy mode includes a flag that enables or disables the energy mode for the memory device; and
   the interface is configured to set or clear the flag.

28. The memory device of claim 25, wherein the energy mode comprises a mode for which the host has sufficient energy for normal operation of the memory device, wherein the normal operation of the memory device includes performing the one or more background operations.

29. The memory device of claim 25, wherein the one or more background operations include at least one of wear leveling, bad block management, wiping, or garbage collection, or any combination thereof.

30. The memory device of claim 25, wherein the energy mode comprises a low energy mode.

* * * * *